(12) United States Patent
Chang et al.

(10) Patent No.: US 7,839,194 B2
(45) Date of Patent: Nov. 23, 2010

(54) CLOCK CIRCUITRY FOR GENERATING MULTIPLE CLOCKS WITH TIME-MULTIPLEXED DUTY CYCLE ADJUSTMENT

(75) Inventors: Kun-Yung Chang, Los Altos, CA (US); Ting Wu, Sunnyvale, CA (US)

(73) Assignee: Rambus Inc., Mountain View, CA (US)

( * ) Notice: Subject to any disclaimer, the term of this patent is extended or adjusted under 35 U.S.C. 154(b) by 103 days.

(21) Appl. No.: 12/256,422

(22) Filed: Oct. 22, 2008

(65) Prior Publication Data
US 2009/0128207 A1     May 21, 2009

Related U.S. Application Data

(60) Provisional application No. 60/989,750, filed on Nov. 21, 2007.

(51) Int. Cl.
H03K 3/017  (2006.01)
(52) U.S. Cl. ......................... 327/175; 327/172
(58) Field of Classification Search ................... None
See application file for complete search history.

(56) References Cited

U.S. PATENT DOCUMENTS

| | | | |
|---|---|---|---|
| 5,008,636 A | 4/1991 | Markinson et al. | 331/2 |
| 5,572,158 A | 11/1996 | Lee et al. | 327/175 |
| 6,040,726 A | 3/2000 | Martin | 327/175 |
| 6,084,452 A | 7/2000 | Drost et al. | 327/175 |
| 6,320,437 B1 | 11/2001 | Ma | 327/175 |
| 6,342,801 B1 | 1/2002 | Shin | 327/175 |
| 6,366,115 B1 | 4/2002 | DiTommaso | 326/32 |
| 6,373,308 B1 | 4/2002 | Nguyen | 327/161 |
| 6,373,309 B1 | 4/2002 | Bang | 327/175 |
| 6,384,652 B1 | 5/2002 | Shu | 327/175 |
| 6,411,145 B1 | 6/2002 | Kueng et al. | 327/175 |
| 6,424,178 B1 | 7/2002 | Harrison | 326/93 |
| 6,426,660 B1 | 7/2002 | Ho et al. | 327/175 |
| 6,448,828 B2 | 9/2002 | Stark et al. | 327/175 |
| 6,452,432 B2 | 9/2002 | Kim | 327/158 |
| 6,459,314 B2 | 10/2002 | Kim | 327/161 |
| 6,466,071 B2 | 10/2002 | Kim et al. | 327/175 |
| 6,486,723 B1 | 11/2002 | DeRyckere et al. | 327/271 |
| 6,501,313 B2 | 12/2002 | Boerstler et al. | 327/175 |
| 6,518,809 B1 | 2/2003 | Kotra | 327/175 |
| 6,535,040 B2 | 3/2003 | Jung et al. | 327/175 |
| 6,535,051 B2 | 3/2003 | Kim | 327/536 |
| 6,566,918 B1 | 5/2003 | Nguyen | 327/115 |
| 6,566,925 B2 | 5/2003 | Ma | 327/175 |
| 6,583,657 B1 | 6/2003 | Eckhardt et al. | 327/175 |
| 6,593,789 B2 | 7/2003 | Atallah et al. | 327/175 |

(Continued)

*Primary Examiner*—Cassandra Cox
(74) *Attorney, Agent, or Firm*—Morgan, Lewis & Bockius LLP

(57) ABSTRACT

Clocking circuitry includes a first clock generator to generate a first clock signal and having a first duty cycle correction input, and a second clock generator to generate a second clock signal and having a second duty cycle correction input. Some embodiments have more than two clock generators. A multiplexer selects between the clock signals from the clock generators. The multiplexer has a first input coupled to the first clock signal and has a second input coupled to the second clock signal, and has a clock output coupled to a clock input of a duty cycle circuit. The duty cycle circuit receives the selected clock signal from the multiplexer and generates a duty cycle correction signal.

18 Claims, 12 Drawing Sheets

U.S. PATENT DOCUMENTS

| | | | |
|---|---|---|---|
| 6,603,337 B2 | 8/2003 | Cho | 327/149 |
| 6,636,098 B1 | 10/2003 | Kizer | 327/345 |
| 6,967,514 B2 * | 11/2005 | Kizer et al. | 327/175 |
| 7,307,461 B2 | 12/2007 | Nguyen et al. | 327/172 |
| 7,595,675 B2 * | 9/2009 | Boerstler et al. | 327/175 |
| 7,612,620 B2 * | 11/2009 | Rausch et al. | 331/45 |
| 7,675,337 B2 * | 3/2010 | Koo | 327/175 |
| 2004/0150453 A1 | 8/2004 | Farjad-rad | 327/307 |
| 2007/0252631 A1 | 11/2007 | Kaviani et al. | 327/295 |

* cited by examiner

700

During distinct time periods for each clock signal of the plurality of clocks signals:
705

Providing the clock signal of the plurality of clocks signals to a duty cycle detector.
710

Generating an cumulative error signal in response to an output of the duty cycle detector.
720

Adjusting the duty cycle of the clock signal in response to the cumulative error signal.
730

Wherein the duty cycle detector is used for processing all of the clock signals of the plurality of clock signals, in sequence, during the distinct time periods.
740

FIGURE 7

CLOCK CIRCUITRY FOR GENERATING MULTIPLE CLOCKS WITH TIME-MULTIPLEXED DUTY CYCLE ADJUSTMENT

RELATED APPLICATIONS

This application claims priority to U.S. Provisional Ser. No. 60/989,750, filed Nov. 21, 2007, which is incorporated herein by reference in its entirety.

TECHNICAL FIELD

The disclosed embodiments relate generally to clock circuits. More particularly, the disclosed embodiments relate to duty cycle adjustment of a plurality of clocks which are time-multiplexed.

BACKGROUND

Clock circuits are useful because, typically, they provide synchronization and control signals to a system. Duty-cycle describes the ratio between the pulse duration ($\tau$) and the period (T) of a rectangular waveform such as a clock signal. Duty-cycle of clock signals (for both transmitter and receiver) is important for the communication systems, including the Double Data Rate (DDR) memory interface. The duty-cycle of a clock signal can be adjusted and maintained by using a duty-cycle adjustment loop.

In an electronic integrated circuit (e.g., a memory device, memory controller or processor), if multiple clocks are present, there is typically an individual duty cycle adjustment circuit for each clock. The duty cycle adjustment circuit (excluding the clock generator) for a clock typically consumes considerable die area of the integrated circuit, and often much of this area is for the duty cycle detector circuit. Therefore the duty cycle adjustment circuits for multiple clocks consume or occupy correspondingly large amounts of die area of the integrated circuit.

Furthermore, in typical implementations it is desirable to make the duty-cycle adjustment circuit large to reduce transistor mismatch and improve accuracy. If multiple instances of the duty-cycle adjustment circuit are used on a die, they may be size limited to meet a size limitation on the die, which may limit accuracy of the duty-cycle adjustment circuits.

BRIEF DESCRIPTION OF THE DRAWINGS

Various embodiments of the invention are disclosed in the following Description of Embodiments herein, in conjunction with the following drawings in which like reference numerals refer to corresponding parts throughout the figures.

FIG. 7 is a flowchart illustrating a first method of multiplexing a duty cycle detector for multiple clocks according to certain embodiments of the invention.

DESCRIPTION OF EMBODIMENTS

In one aspect of the invention, clocking circuitry includes a first clock generator to generate a first clock signal and having a first duty cycle correction input, and a second clock generator to generate a second clock signal and having a second duty cycle correction input. Some embodiments have more than two clock generators. The circuitry also includes a duty cycle circuit to receive a clock input and to generate a duty cycle correction signal on an output of the duty cycle circuit. A multiplexer selects between the clock signals from the clock generators. The multiplexer has a first input coupled to the first clock signal and has a second input coupled to the second clock signal, and has a clock output coupled to a clock input of the duty cycle circuit.

In another aspect of the invention, clock circuitry includes a multiplexer having a first input and second input, a duty cycle circuit coupled to an output of the multiplexer, and a clock generator circuit. In some embodiments the multiplexer has more than two inputs, depending on the number of clock signals present. The duty cycle circuit generates a duty cycle correction signal for the clock signal selected by the multiplexer. The clock generator circuit includes a duty cycle shaping circuit, having an clock signal input and another input that is coupled to a correction signal output of the duty cycle circuit. The clock generator circuit also includes a transmit clock buffer and a receive clock buffer. The transmit clock buffer is coupled to the output of the duty cycle shaping circuit and has a transmit clock output coupled to the first input of the multiplexer. The receive clock buffer is coupled to the output of the duty cycle shaping circuit and has a receive clock output coupled to the second input of the multiplexer.

In another aspect of the invention, a method of adjusting the duty cycles of a plurality of clock signals is performed during distinct time periods for each clock signal of the plurality of clocks signals. During each of the distinct time periods, the following operations are performed. A respective clock signal of the plurality of clocks signals is provided to a duty cycle detector. An error signal is generated in response to an output of the duty cycle detector, and the duty cycle of the respective clock signal is adjusted in response to the error signal. In the method, the same duty cycle detector is used for processing all of the clock signals of the plurality of clock signals, in sequence, during the distinct time periods.

Figure 1A:
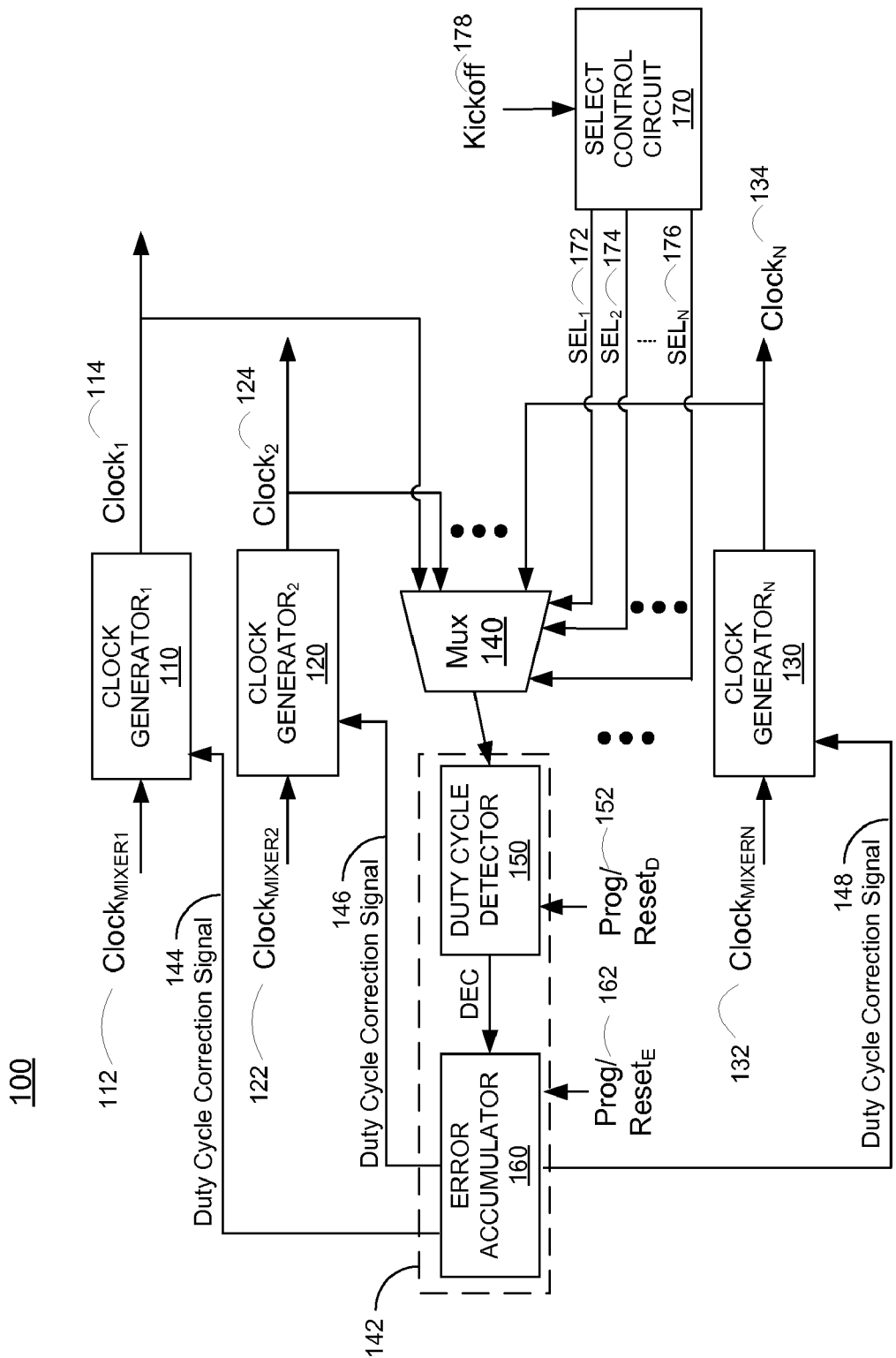
FIG. 1A is a block diagram illustrating a first exemplary time multiplexed multiple clocks duty-cycle adjustment according to certain embodiments of the invention.

FIG. 1A is a block diagram illustrating a first embodiment of clock circuitry 100. Clock circuitry 100 includes a first clock generator 110, a second clock generator 120, and an Nth clock generator 130. In FIG. 1A and all subsequent figures, the Nth value is determined by the number of clocks in the multiplexed circuit. For example, if there are five clocks to be multiplexed, then N has a value of five.

First clock generator 110 and second clock generator 120 each have an input coupled to a respective input clock signal 112 ($Clock_{Mixer1}$), 122 ($Clock_{Mixer2}$), and another input coupled to a respective output of a duty cycle correction circuit 142. Duty cycle correction signals 144, 146 produced by the duty cycle correction circuit 142 are coupled to the first and second clock generators. The first clock generator 110 uses the first input clock signal 112 and the first duty cycle correction signal 144 to generate a first output clock signal 114, and the second clock generator 120 uses the second input clock signal 122 and the second duty cycle correction signal 146 to generate a second output clock signal 124. Nth clock generator 130 has an input coupled to an nth input clock signal 132, and an input coupled to the duty cycle correction circuit 142. Nth clock generator 130 uses the Nth input clock signal and an Nth duty cycle correction signal 148 to generate a Nth output clock signal 134.

Circuitry 100 further includes a select control circuit 170. The select control circuit 170 receives a kickoff signal 178. When the select control circuit receives the kickoff signal 178, the select control circuit starts generating select signals which are provided to a multiplexer 140. The generated select signals include a first select signal 172, a second select signal 174, and an Nth select signal 176 respectively. In one embodiment, at any given time no more than one select signal is active.

Multiplexer 140 has N inputs coupled to the N clock output signals 114, 124, 134 respectively. Multiplexer 140 also has N select inputs coupled to select signals 172, 174, 176 respectively. Based upon the select input value, the multiplexer 140 selects the respective input clock and outputs it.

The duty cycle correction circuit 142 includes a duty cycle detector 150, which has an input coupled to the output of multiplexer 140. Thus, the clock signal selected by the multiplexer 140 in response to the select signals 172, 174, 176 is provided to the duty cycle detector 150. The duty cycle detector determines the duty cycle of the input clock, and generates a decision signal 'DEC', for instance '1' when the duty-cycle of the input clock is more than 50% and '0' when the duty-cycle less than 50%. In other embodiments, the decision signal may be made in response to other values. Duty cycle detector 150 has an input 152 which may in one embodiment be a program signal, or a reset signal, or another control signal, depending on the implementation. In one embodiment, the signal 152 may be used to reset the duty cycle detector each time that it begins to process a selected clock signal. In one embodiment, the signal 152 may be used to program a threshold or other parameter of the duty cycle detector 150 to a value specified by the signal 152.

The duty cycle correction circuit 142 also includes error accumulator 160, which has an input coupled to the decision output DEC of the duty cycle detector 150. According to the decision output, the error accumulator 160 generates control bits for the duty-cycle of the respective clock which is coupled to the duty cycle detector through the multiplexer 140. The control bits are provided to the respective clock and are used to adjust the duty cycle of that clock in the respective clock generator 110, 120, 130. The error accumulator 160 receives an input signal 162 which may in one embodiment be a program signal, or a reset signal, or another control signal, depending on the implementation. In one embodiment, the signal 162 may be used to reset the error accumulator 160. In some embodiments, the signal 162 may be used to program a parameter of the error accumulator 160 to a value specified by the signal 162.

Figure 1B:
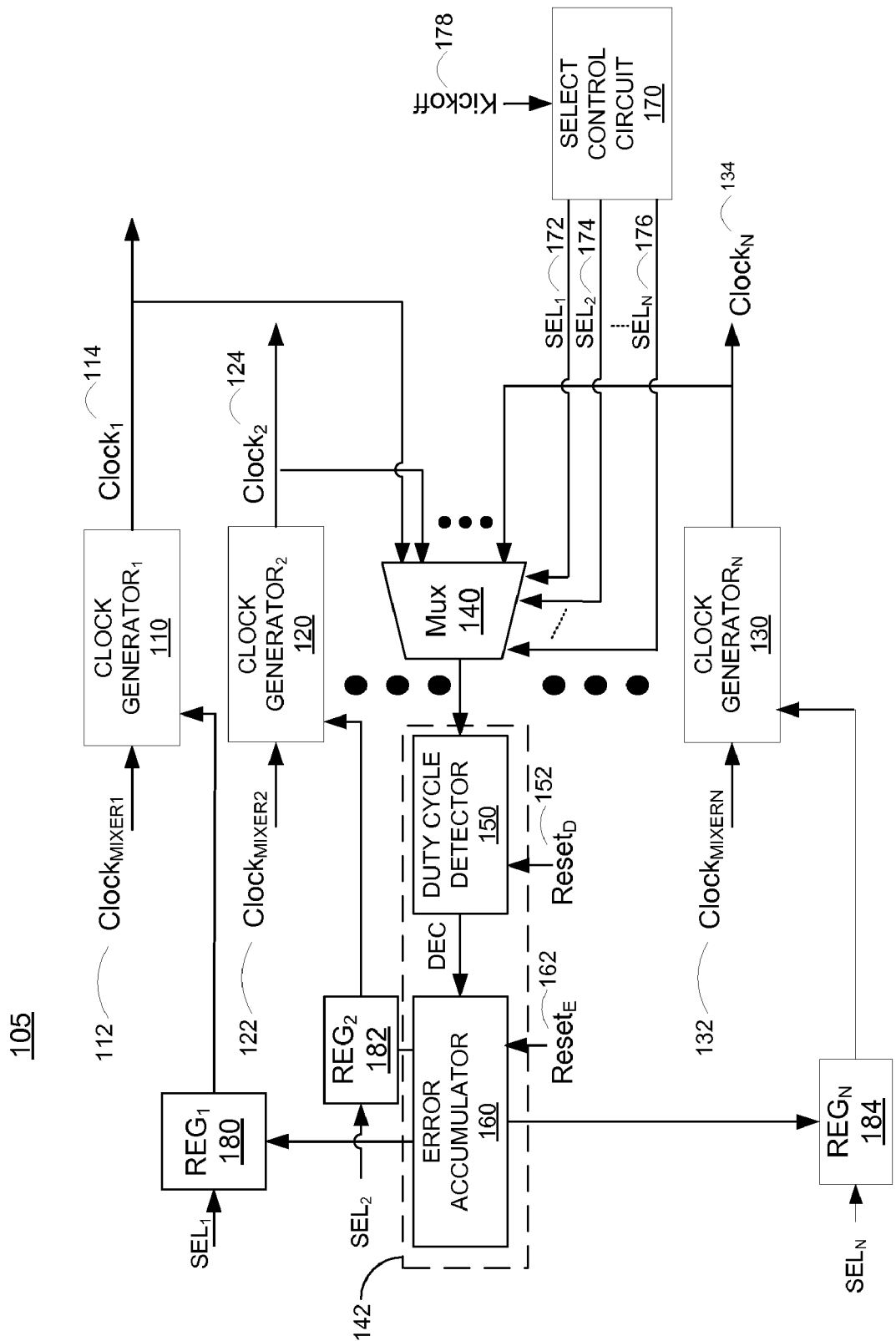
FIG. 1B is a block diagram illustrating a second exemplary time multiplexed multiple clocks duty-cycle adjustment according to certain embodiments of the invention.

FIG. 1B is a block diagram illustrating a second example of clock circuitry 105 that has time multiplexed duty cycle adjustment circuitry. The second clock circuitry 105 is similar to first clock circuitry 100, and therefore only the differences are explained. In second clock circuitry 105, a first register 180 is coupled between error accumulator 160 (which is part of duty cycle correction circuit 142) and first clock generator 110. The first register 180 stores control bits generated by error accumulator 160 to control first clock generator 110. The first register 180 is enabled by first select signal 172. Similarly, a second register 182 and Nth register 184 are coupled between the error accumulator 160 and the second 120 and Nth 130 clock generators respectively, and are controlled by select signals 174 and 176 respectively.

Thus, when the select control circuit 170 enables first select signal 172, this causes the multiplexer 140 to provide first clock signal 114 to the duty cycle detector 150 and error accumulator 160. The error accumulator 160 provides control bits (e.g., a cumulative duty cycle error value) to register 180 enabled by a select signal 172 which then provides the control bits to first clock generator 110 to adjust the duty cycle of first clock 114. Similarly, control signal 174 controls the selection of the second clock 124 and the storage of control bits in register 182, and control signal 176 controls the selection of the Nth clock and the storage of control bits in the register 184.

In one embodiment, registers 180, 182 and 184 may be individual registers. In some embodiments, registers 180, 182 and 184 are part of the error accumulator 160. Alternately, registers 180, 182 and 184 are part of the respective clock generator circuits 110, 120, 130. In yet other embodiments, registers 180, 182 and 184 are placed in different circuit locations than stated above, or in any mix of the above locations.

Figure 2A:
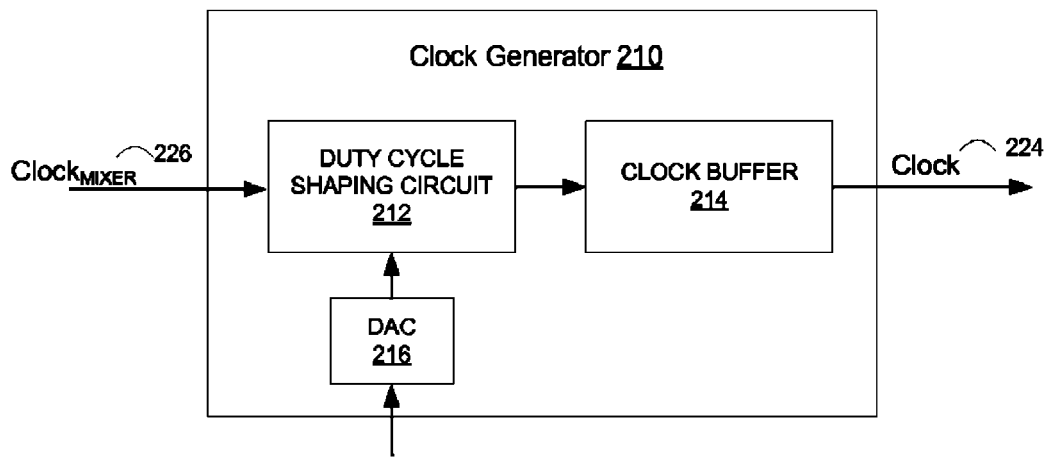
FIG. 2A is a block diagram illustrating a first clock generator according to certain embodiments of the invention.

FIG. 2A is a block diagram illustrating a first clock generator circuit 200 according to certain embodiments of the invention. Circuit 200 includes a clock generator 210, having an input clock 226 ($Clock_{Mixer}$) and a clock output 224. Clock generator 210 includes a digital to analog converter (DAC) 216, and a duty cycle shaping circuit 212 which has an input coupled to the input clock 226 and another input coupled to DAC 216. The duty cycle shaping circuit 212 has an output coupled to a clock buffer 214. Clock buffer 214 buffers the clock and provides a buffered output clock signal 224. The digital to analog converter 216 receives a control value (e.g., duty cycle control bits from the error accumulator 160) and based on the control value provides an analog duty cycle difference to the duty cycle shaping circuit 212. The duty cycle shaping circuit 212 uses the input clock 226 and the analog duty cycle difference to generate a clock with an adjusted duty cycle which is output to clock buffer 214, which in turn produces the clock output 224. U.S. Pat. No. 6,967,514, which is incorporated herein by reference in its entirety, discloses an embodiment of the clock generator 210.

Figure 2B:
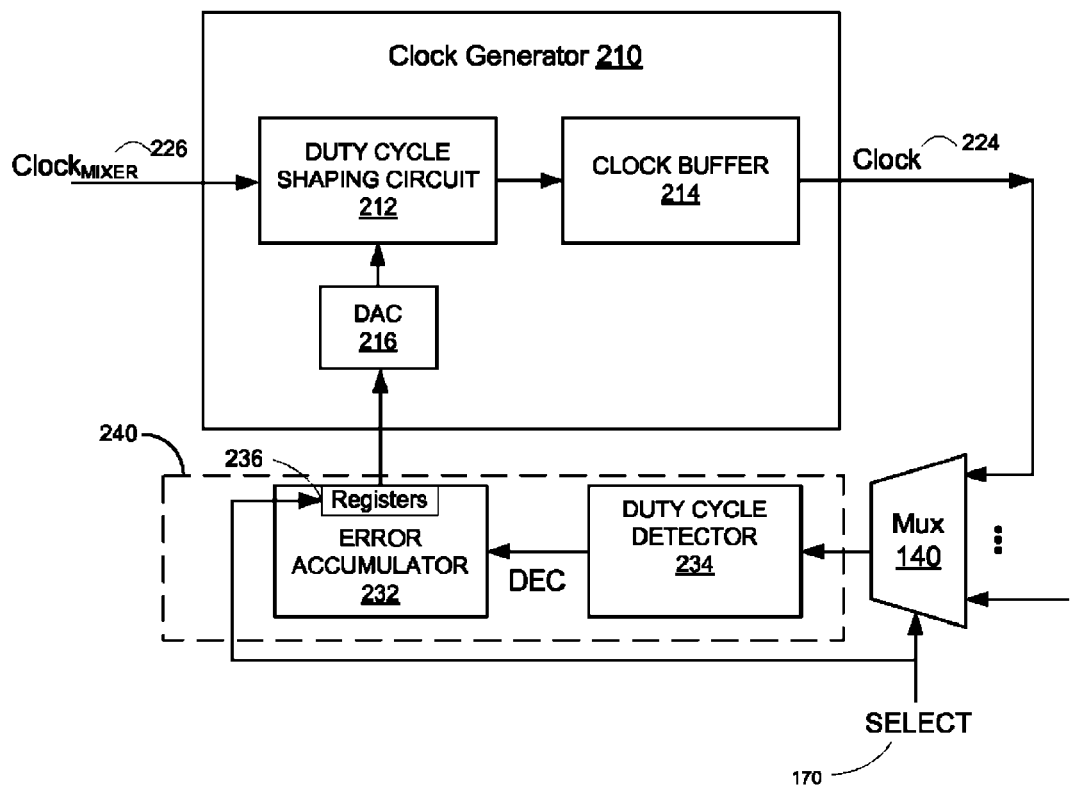
FIG. 2B is a block diagram illustrating a second clock generator according to certain embodiments of the invention.

FIG. 2B is a block diagram illustrating a second clock generator circuit 230 according to certain embodiments of the invention. Circuit 230 includes a clock generator 210 as described above. Circuit 230 further includes multiplexer 140 as described earlier, duty cycle detector 234 and error accumulator 232. Multiplexer 140 selects between a plurality of clocks, including clock signal 224, based upon the value of a select control 170. The output of multiplexer 140 is coupled to duty cycle detector 234, which determines the duty cycle and generates a decision output which is provided to error accumulator 232. The duty cycle detector 234 and error accumulator 232 form a duty cycle correction circuit 240.

The error accumulator 232 generates a control value (e.g., a duty cycle correction value) that it stores in register bank 236. The register bank 236 has a plurality of registers, including a distinct register for each of the clocks whose duty cycle is to be adjusted by the multiplexed duty cycle correction circuit 240. In one embodiment the registers may be grouped according to which clock signal they correspond to. In one embodiment the register in which the control value produced by error accumulator 232 is stored is controlled by select control 170, and corresponds to the clock selected by multiplexer 140 in response to select signal 170.

Figure 2C:
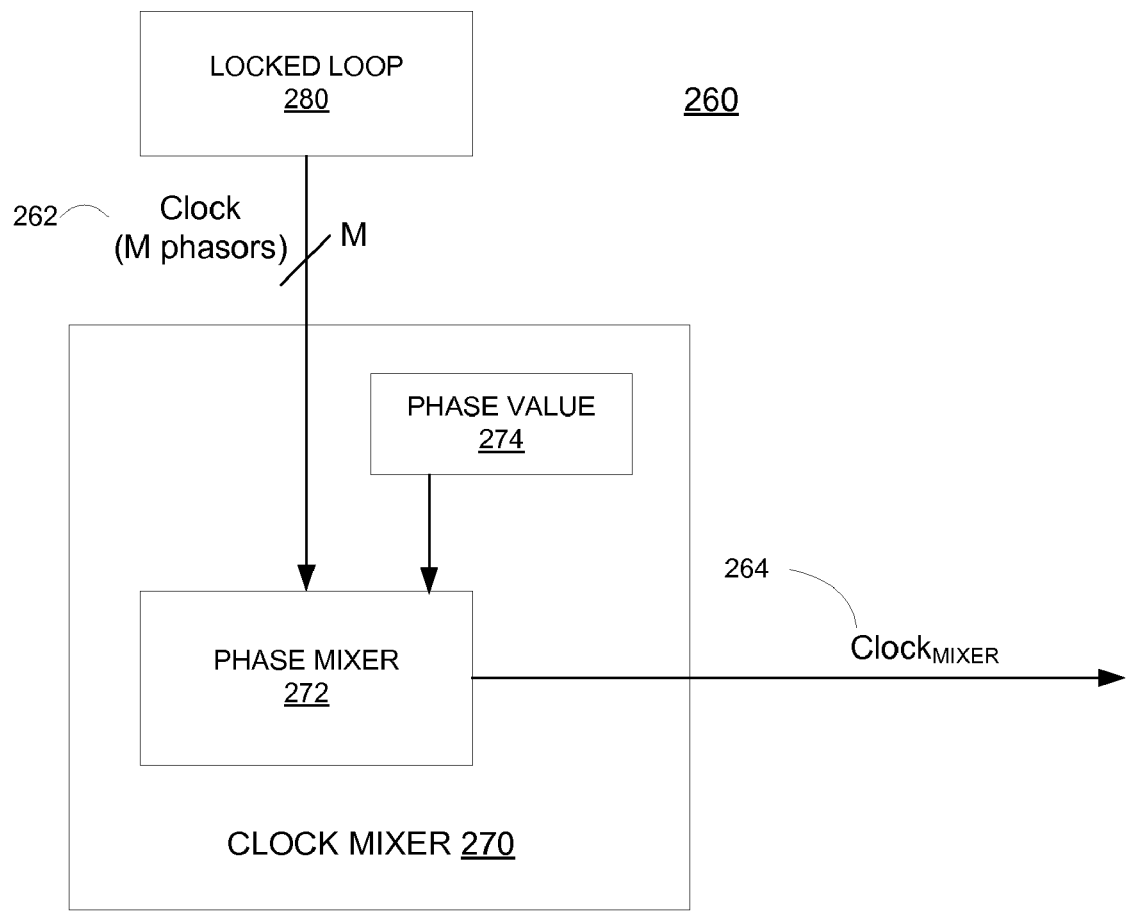
FIG. 2C is a block diagram illustrating a clock mixer according to certain embodiments of the invention.

FIG. 2C is a block diagram illustrating a clock mixer circuit 260 according to certain embodiments of the invention. Circuit 260 includes a locked loop 280 which generates M clock signals 262, sometimes called phasors. The M clock signals or phasors 262 are sometimes collectively called "a clock signal" for convenience. The M clock signals 262 all have the same frequency, and thus are mesochronous. In some embodiments, the M phasors have evenly spaced relative phases (e.g., eight phasors having relative phases in 45 degree increments, or four phasors having relative phases in 90 degree increments). In one embodiment, locked loop 280 is (or includes) a phase locked loop (PLL). In another embodiment, locked loop 280 is (or includes) a delay locked loop (DLL). Circuit 260 also includes a clock mixer 270, which includes a phase mixer 272 and a phase value 274. Based upon a phase value 274, which may be provided by a register or by a source internal to or external to the integrated circuit in which the clock mixer circuit 260 resides, the phase mixer 272 generates a clock signal 264 (sometimes called a mixed clock signal) having a phase corresponding to the phase value 274. For example, in one embodiment the phase mixer 272 selects two of the phasors 262 that most closely correspond to the phase value 274, and then interpolates between those two phasors to produce the mixed clock signal 264.

Figure 2D:
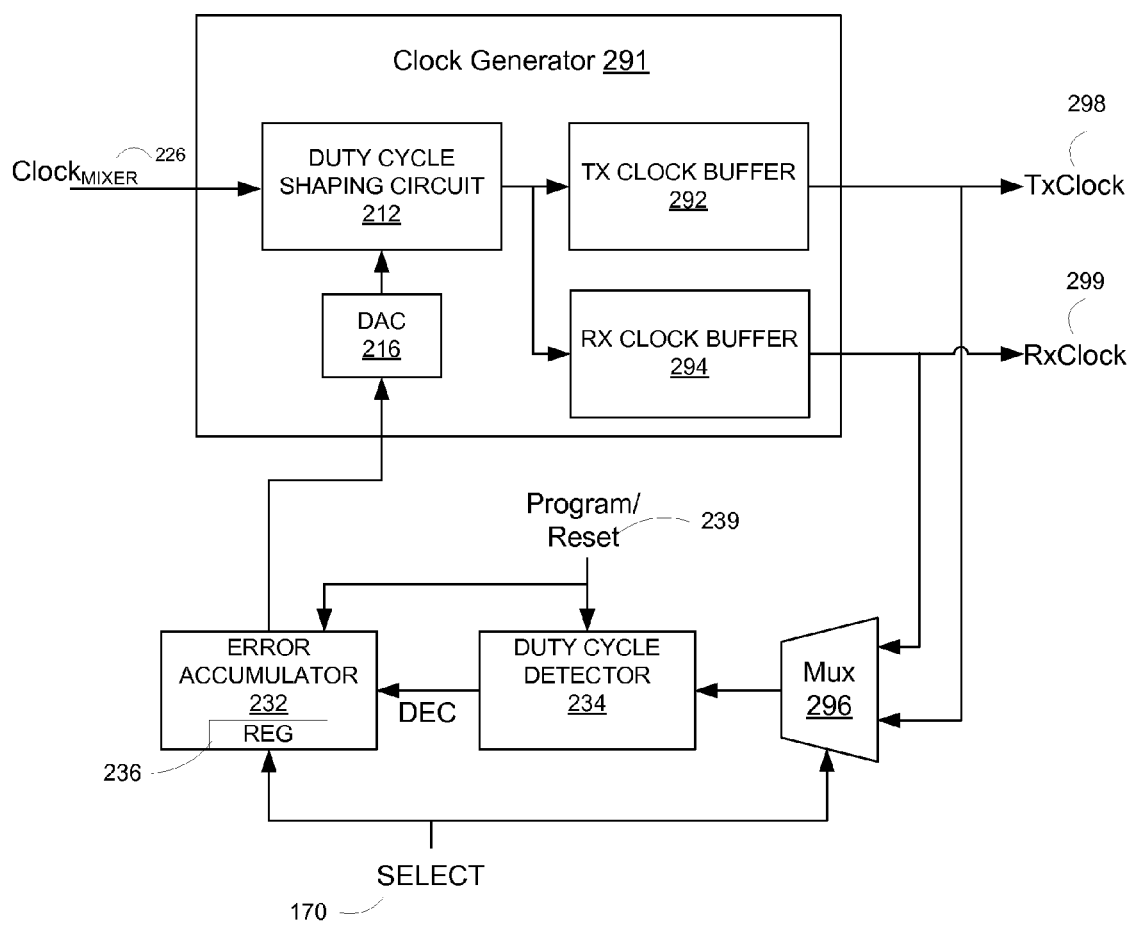
FIG. 2D is a block diagram illustrating a third clock generator according to certain embodiments of the invention.

FIG. 2D is a block diagram illustrating a third clock generator circuit 290 according to certain embodiments of the invention. Circuit 290 includes a clock generator 291 having a duty cycle shaping circuit 212 and a digital to analog converter (DAC) circuit 216 both as described earlier. Clock generator 291 also includes a transmit clock buffer 292, and a receive clock buffer 294. Duty cycle shaping circuit 212 receives a mixed clock signal 226 and an analog duty cycle adjustment signal from the DAC 216, and generates a duty cycle-adjusted clock signal which is output to transmit clock buffer 292 and to receive clock buffer 294. In one embodiment, the buffers 292 and 294 can each introduce distinct duty cycle distortion into their respective clock signals. The transmit clock buffer 292 outputs a transmit clock 298. The receive clock buffer 294 outputs a receive clock 299. Transmit clock 298 and receive clock 299 are provided to a multiplexer 296. Multiplexer 296 is controlled by a select signal 170, and provides a selected one of the clock signals to a duty cycle detector 234. Duty cycle detector 234 determines the duty cycle of the input clock, and generates a decision signal 'DEC' which it provides to error accumulator 232, that functions as described above. Error accumulator 232 includes a register bank 236, that functions as described above. Select signal 170 is provided to error accumulator 232 and to multiplexer 296 to select the transmit clock 298 or receive clock 299 for which duty cycle correction is to be performed and to select a corresponding register in which a control value is to be stored. Error accumulator 232 generates the control value, representing a duty cycle adjustment, that is to be stored in a corresponding register and provided to DAC 216.

In FIG. 2D a control signal 239 is provided to both the duty cycle detector 234 and the error accumulator 232. Control signal 239 is a program signal, or a reset signal, or another control signal, depending on the implementation. In one embodiment, control signal 239 may be used to reset the duty cycle detector and error accumulator. In one embodiment, control signal 239 may be used to program one or more parameters of the duty cycle detector and/or error accumulator to values specified by the control signal 239.

Figure 3:
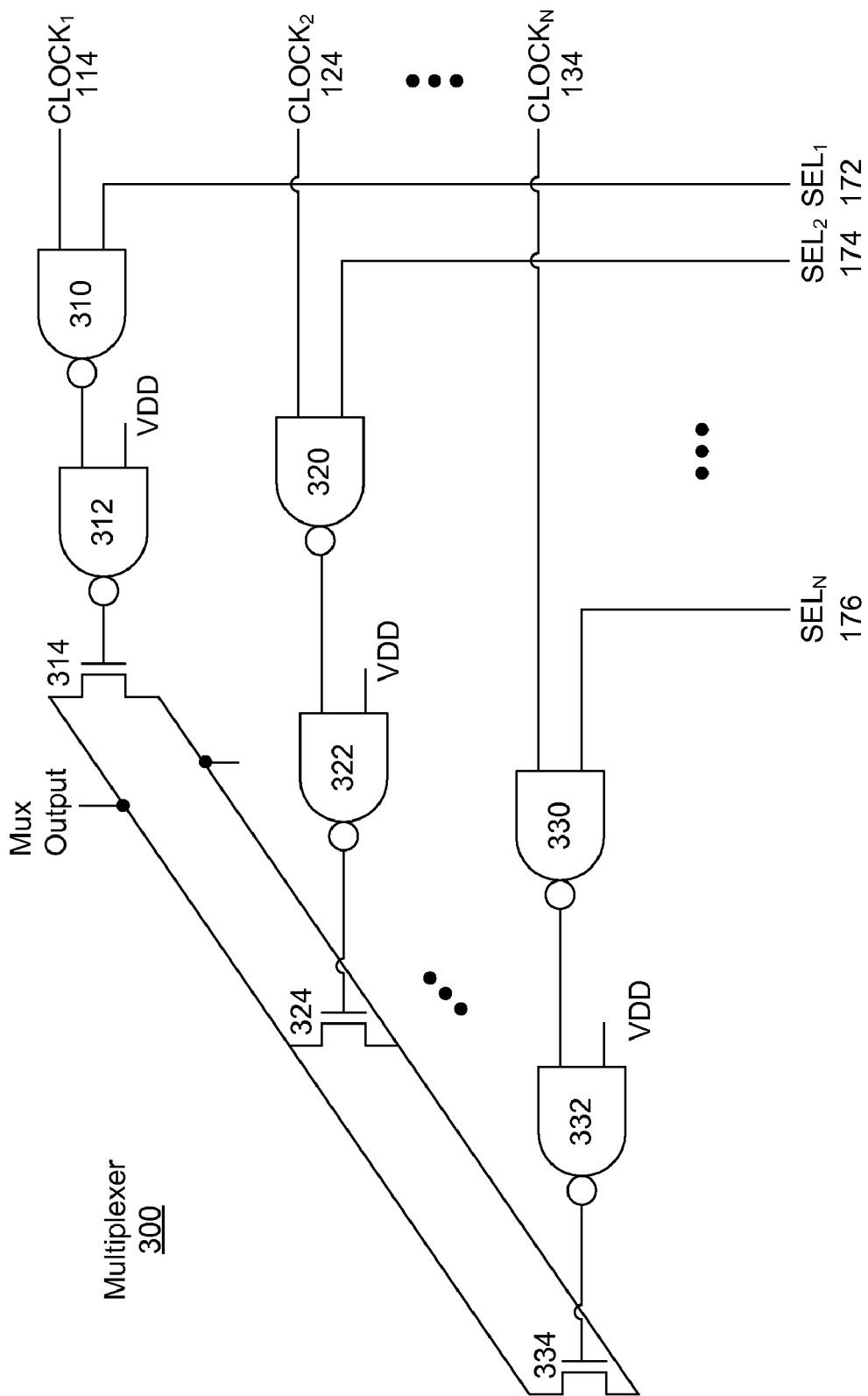
FIG. 3 is a block diagram illustrating a multiplexer according to certain embodiments of the invention.

FIG. 3 is a block diagram illustrating a multiplexer circuit 300 according to certain embodiments of the invention. Multiplexer circuit 300 includes a first clock path comprising a first NAND gate 310 having an output coupled to second NAND gate 312 having an output coupled to transistor 314. First NAND gate 310 has a first input coupled to first clock 114, and has a second input coupled to first select signal 172. Second NAND gate has an input coupled to VDD (power level voltage). Transistor 314 controls the multiplexer output. The first clock path operates in the following manner. When the first select signal 172 is active (high, logic 1), then the first NAND gate 310 permits the first clock 114 to pass to the second NAND gate 312, which permits the first clock 114 to pass to transistor 314 and control the multiplexer output. When the first select signal 172 is inactive (low, logic 0) then the first transistor 314 is inactive and therefore the first clock 114 does not control the multiplexer output.

Multiplexer circuit 300 includes a second clock path comprising second clock signal 124, NAND gate 320, NAND gate 322 and second transistor 324, and is controlled by second select signal 174. Multiplexer circuit 300 further includes an Nth clock path comprising Nth clock signal 134, NAND gate 330, NAND gate 332 and Nth transistor 324, and is controlled by Nth select signal 176. The second clock path and Nth clock path operate in the same manner as the first clock path. The second clock path selectively passes second clock signal 124 to the multiplexer output only when the second select signal 174 is active, and the Nth clock path selectively passes Nth clock signal 124 to the multiplexer output only when the Nth select signal 176 is active.

Figure 4A:
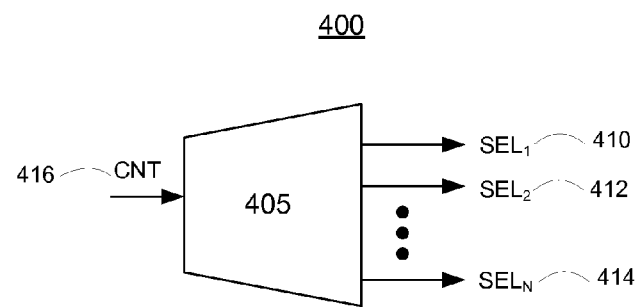
FIG. 4A is a block diagram illustrating a demultiplexer selector circuit according to certain embodiments of the invention.

FIG. 4A is a block diagram illustrating a demultiplexer selector circuit 400 according to certain embodiments of the invention. Circuit 400 includes a demultiplexer 405 having a count input 416, and having N select signal outputs, where N is an integer greater than one (or equivalently, greater than or equal to two). In the embodiment shown in FIG. 4A, N is an integer greater than or equal to three. The N select signal outputs include a first select signal 410, a second select signal 412, and a Nth select signal 414. The circuit 405 activates one of the select signal outputs corresponding to a value of the count input 416.

Figure 4B:
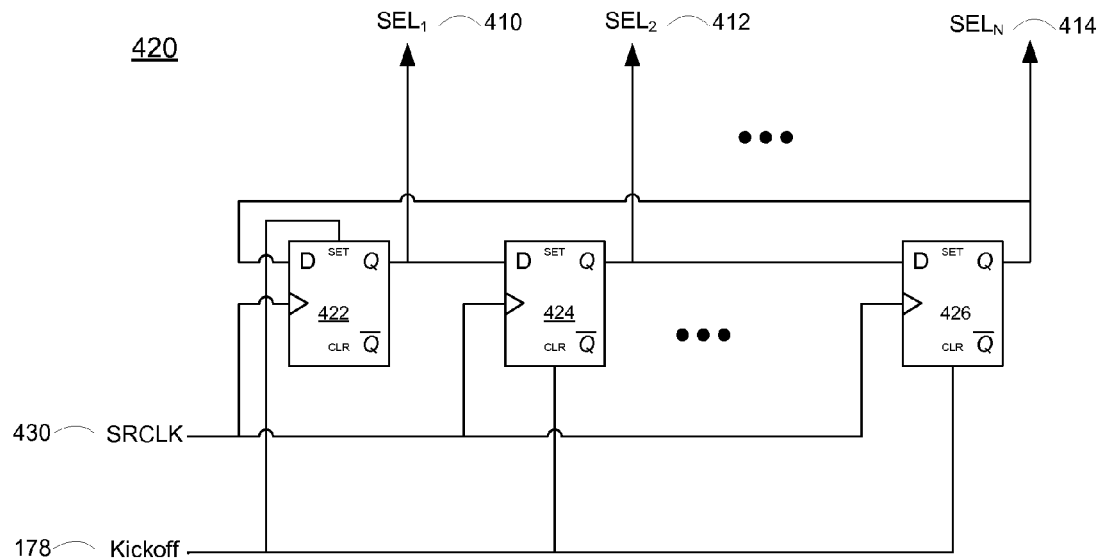
FIG. 4B is a block diagram illustrating a shift register circuit according to certain embodiments of the invention.

FIG. 4B is a block diagram illustrating a shift register circuit 420 according to certain embodiments of the invention. Shift register circuit 420 includes a first register 422, a second register 424, and an Nth register 426. Each of the registers is clocked by shift register clock signal 430, and controlled by Kickoff signal 178. Kickoff signal 178 is used to initialize the shift register circuit 420 to a predefined state, in which only one of the registers of the circuit 420 outputs an enabled select signal. The first register 422 has a set input coupled to Kickoff signal 178; thus when the Kickoff signal 178 is active, register 422 is set to store a high value, and to output a high value on output Q. The second register 424 and the Nth register 426 both have reset inputs coupled to reset signal 432; thus when the Kickoff signal 178 is active, registers 424 and 426 are set to store a low value, and to output a low value on output Q. The output of first register 422 drives first select signal 410 and the input of the second register 424. The output of second register 424 drives second select signal 412 and the input of a next register. The output of nth register 426 drives nth select signal 414.

Shift register circuit 420 operates in the following manner. When the Kickoff signal goes active, a logic high value is stored in first register, and all other registers in the shift register circuit store a logic low value. Then, on each rising edge of the shift register clock signal 430, the logic high value is propagated through the shift register, and thus enables (e.g. logic high) each select signal in turn while keeping all other select signals at disabled (e.g. logic low). In other embodiments using active low logic, the sets and resets could be reversed while maintaining functionality.

Figure 5A:
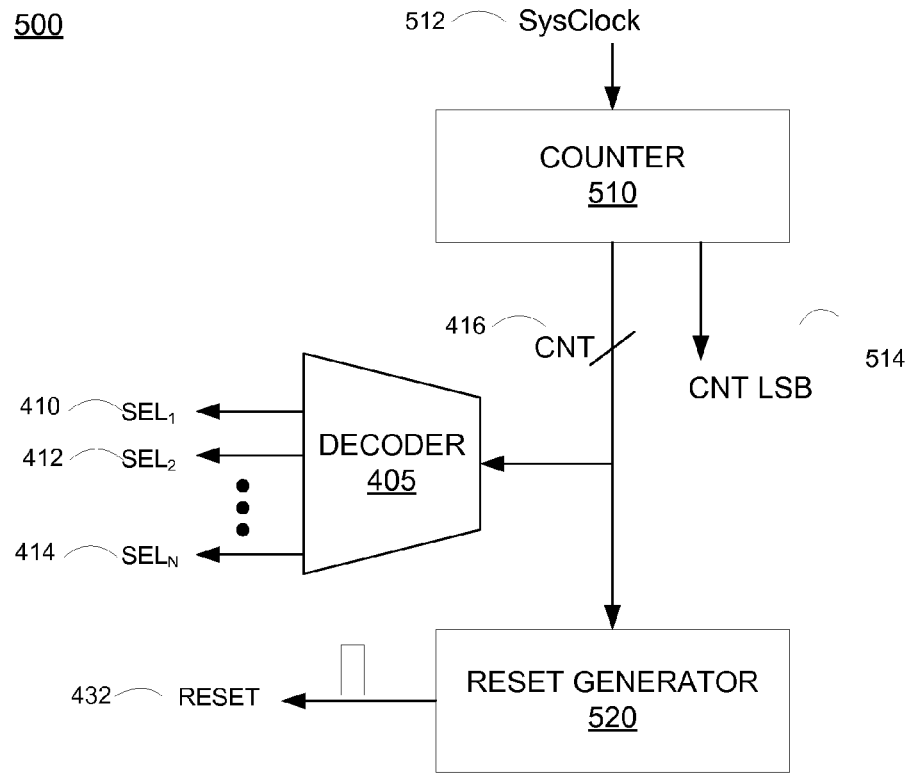
FIG. 5A is a block diagram illustrating a first reset and selector circuit according to certain embodiments of the invention.

FIG. 5A is a block diagram illustrating a first reset and selector circuit 500 according to certain embodiments of the invention. Circuit 500 includes a counter 510, having as an input a system clock signal 512. In one embodiment, at each rising edge of system clock signal 512, the counter advances one count. Alternately, the counter decrements one count for each rising (or falling) edge of the system clock signal 512. The counter 510 provides a count output, comprising a count signal CNT 416, and a set of count least significant bits (CNT LSB) 514. In one embodiment, circuit 500 includes a demultiplexer 405 (also called a decoder) and a reset generator 520. The demultiplexer 405 operates as described earlier, and has select outputs 410, 412, and 414 as described earlier. In one embodiment, the reset generator 520 generates a reset signal 432 whenever the count signal CNT 416 changes value. The reset signal 432 can be used to reset the multiplexed duty cycle circuitry 142 each time it starts processing a newly selected clock signal. In some embodiments, the reset signal 432 produced by the reset generator 520 is a pulse having a predefined duration that is much shorter than (e.g., less than one percent of) the period of time used to check and adjust the duty cycle of a selected clock signal. In some embodiments, the duty cycle of a selected clock may be adjusted a plurality of times during the period of the select signal, and after each adjustment the reset signal is enabled to reset the duty cycle detector. As a result, in these embodiments the reset signal is enabled a plurality of times during each period of the select signal. The control signals for accomplishing multiple duty cycle adjustments and resets during each period of the select signal are particular bits (e.g., an MSB bit and another bit) output by counter 540 or logical combinations of bits output by counter 540.

Figure 5B:
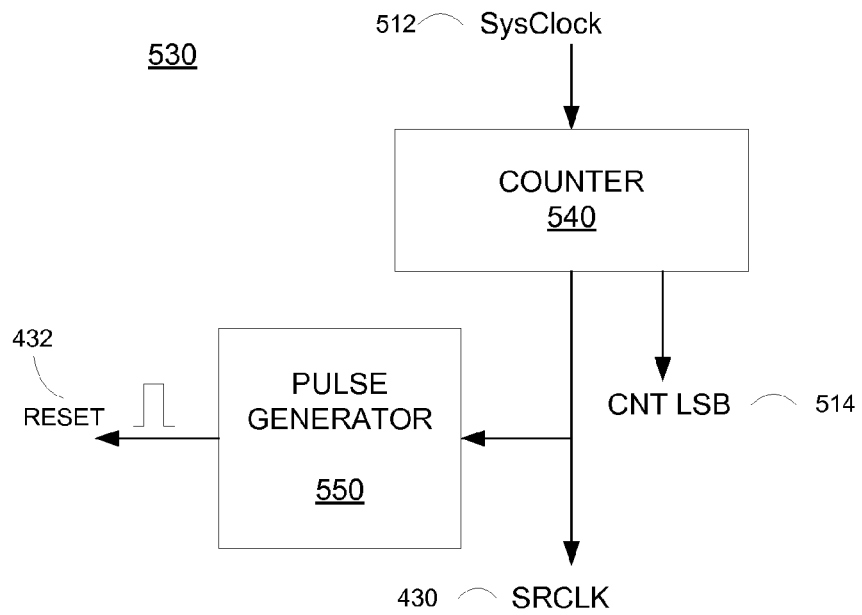
FIG. 5B is a block diagram illustrating a reset and shift register clock circuit according to certain embodiments of the invention.

FIG. 5B is a block diagram illustrating a reset and shift register clock circuit 530 according to certain embodiments of the invention. Circuit 530 includes a counter 540 having as an input a system clock 512 as described earlier. The counter 540 may generate a set of least significant bits, CNT LSB 514, as described earlier, and a most significant bit that is used as a shift register clock signal 430. The shift register clock signal 430 is provided to a pulse generator 550, which produces a reset signal 432 each time the shift register clock signal 430 has a predefined transition (e.g., a rising edge, or a falling edge). In one embodiment the counter output bit used to generate the shift register clock signal 430 is formed from a count output bit that is more significant than the bits of the CNT LSB 514. The shift register clock signal 430 may be used to drive a shift register circuit 420 (an example of which is described above with reference to FIG. 4B).

The reset signal 432 produced by pulse generator 550 can be used to reset the multiplexed duty cycle circuitry 142 each time it starts processing a newly selected clock signal. In some embodiments, the reset signal 432 produced by the pulse generator 550 is a pulse having a predefined duration that is much shorter than (e.g., less than one percent of) the period of time used to check and adjust the duty cycle of a selected clock signal.

Figure 5C:
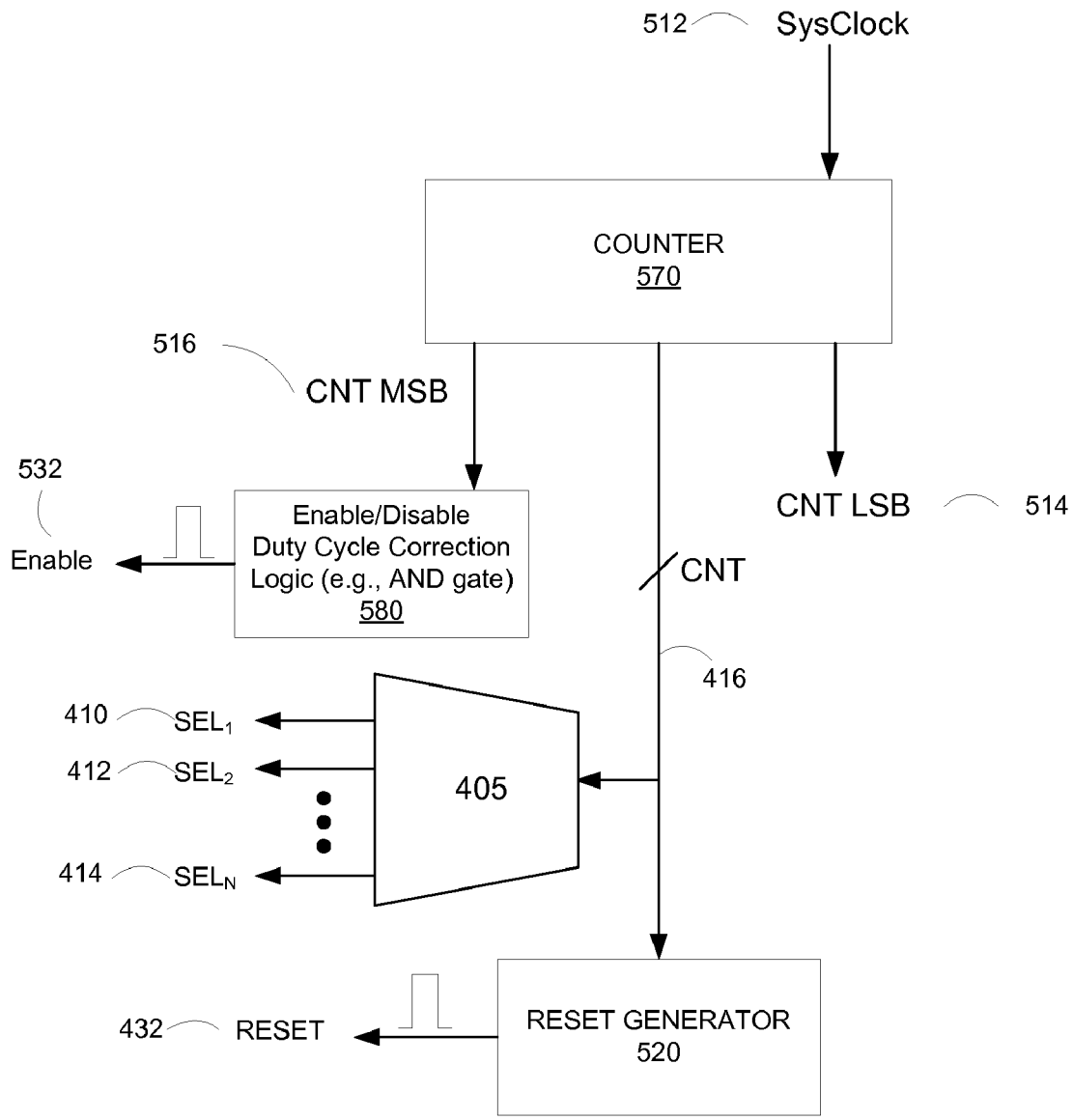
FIG. 5C is a block diagram illustrating a second reset and selector circuit according to certain embodiments of the invention.

FIG. 5C is a block diagram illustrating a second reset and selector circuit 560 according to certain embodiments of the invention. Circuit 560 includes a counter 570, having as an input a system clock 512 as described earlier. The counter 570 may generate a count LSB 514 as described earlier, and may generate a count most significant bit (MSB) 516. The count LSB 514 may include multiple bits, and the count MSG may include multiple bits. The counter 570 also generates a count value 416 which is coupled to a demultiplexer 405 having select outputs as described earlier, and to a reset generator 520 having a reset output 432 as described earlier. The count MSB 516 is coupled to logic circuit 580 that generates an enable/disable signal 532 that enables and disables the multiplexed duty cycle correction circuit (e.g., circuit 142 of FIG. 1A). For example, when the count MSB 516 equals a predetermined value (e.g., zero), the logic circuit 580 produces an enable/disable signal 532 that enables operation of the multiplexed duty cycle correction circuit. For all other values of the count MSB 516, the logic circuit 580 produces an enable/disable signal 532 that disables operation of the multiplexed duty cycle correction circuit. In this way, the multiplexed duty cycle correction circuit operates only during a portion of the system operation, thereby reducing the amount of power consumed by the duty cycle correction circuitry. In the embodiment shown in FIG. 5C, the portion of the system operation during which the duty cycle correction circuitry operates depends on the number of bits in the CNT MSB 516 and the number of CNT MSB values for which the logic produces an enable signal 532.

Figure 6:
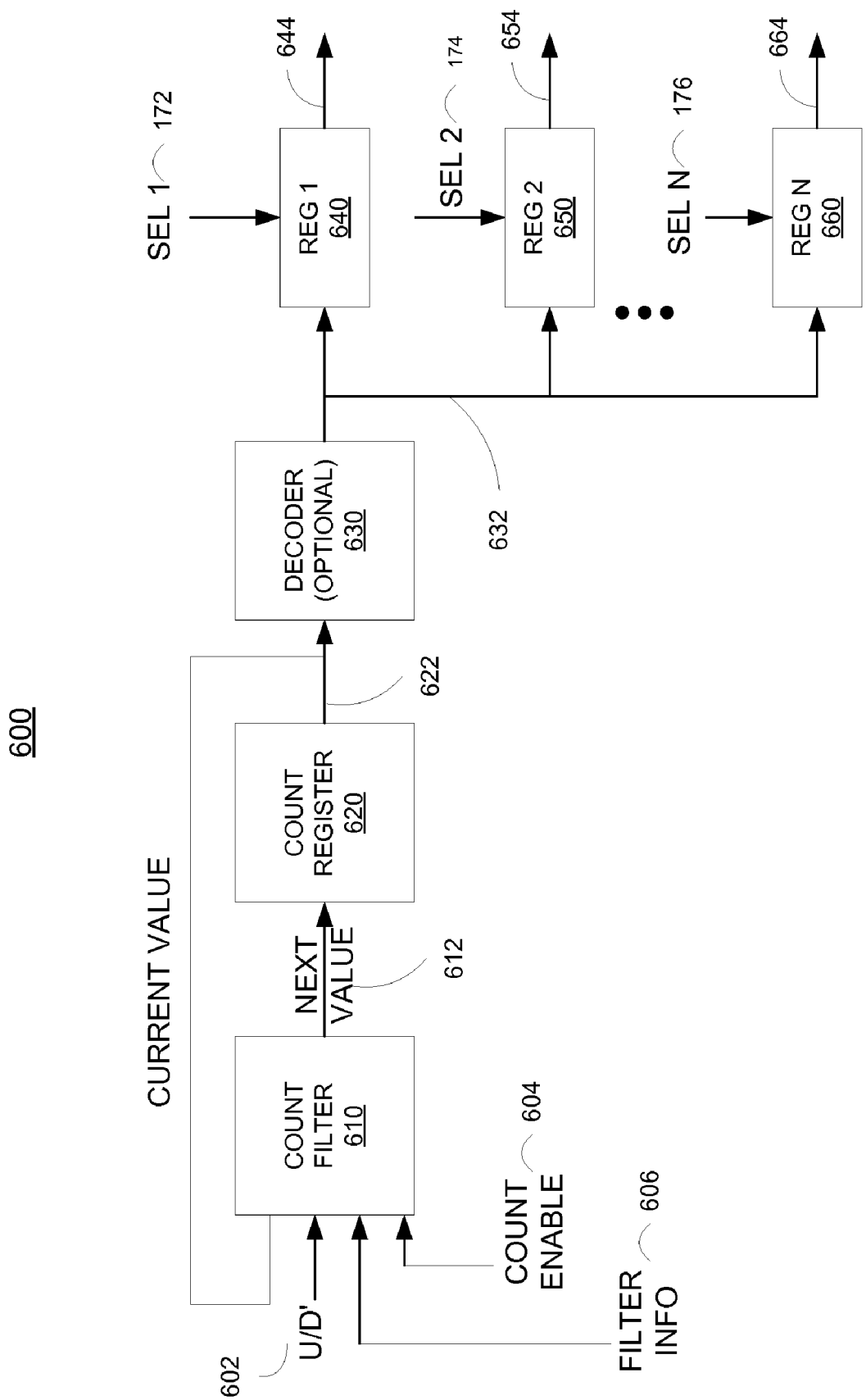
FIG. 6 is a block diagram illustrating an error accumulator circuit according to certain embodiments of the invention.

FIG. 6 is a block diagram illustrating an error accumulator circuit 600 according to certain embodiments of the invention. Circuit 600 includes a count filter 610, which has an output coupled to a count register 620. Count register 620 generates a current value signal 622, and is optionally coupled to a decoder 630. A decoded output 632 of decoder 630 is coupled to a plurality of select registers, including a first select register 640, a second select register 650 and an Nth select register 660.

Count filter 610 receives as inputs the current value signal 622, a count enable signal 604 indicating the occurrence of an incremental error voltage passing a threshold voltage to generate an incremental error signal, an up/down signal 602 indicating whether the error was positive or negative, and a filter information signal 606 providing status information. Count filter 610 generates the next value signal 612, which represents the filtered incremental error signal and outputs it to count register 620, which outputs the accumulated error signal (also called the current value signal 622).

The first select register 640 receives as an input a first select signal 172 as described earlier, and generates an output 644 representing the accumulated error corresponding to the first clock and the first select signal 172. Similarly, the second select register 650 generates an output 654 corresponding to the second clock and the second select signal 174, and the Nth select register generates an output 664 corresponding to the Nth clock and the Nth select signal 176.

FIG. 7 is a flowchart illustrating a first method 700 of multiplexing a duty cycle detector for multiple clocks according to certain embodiments of the invention. The method 700 provides that during distinct time periods for each clock signal of a plurality of clock signals, certain operations are performed 705. A respective clock signal of the plurality of clock signals is provided to a duty cycle detector (710). An error signal is generated in response to an output of the duty cycle detector (720), and the duty cycle of the clock signal is adjusted in response to the error signal (730). The same duty cycle detector is used for processing all of the clock signals of the plurality of clock signals, in sequence, during the distinct time periods (740).

Figure 8:
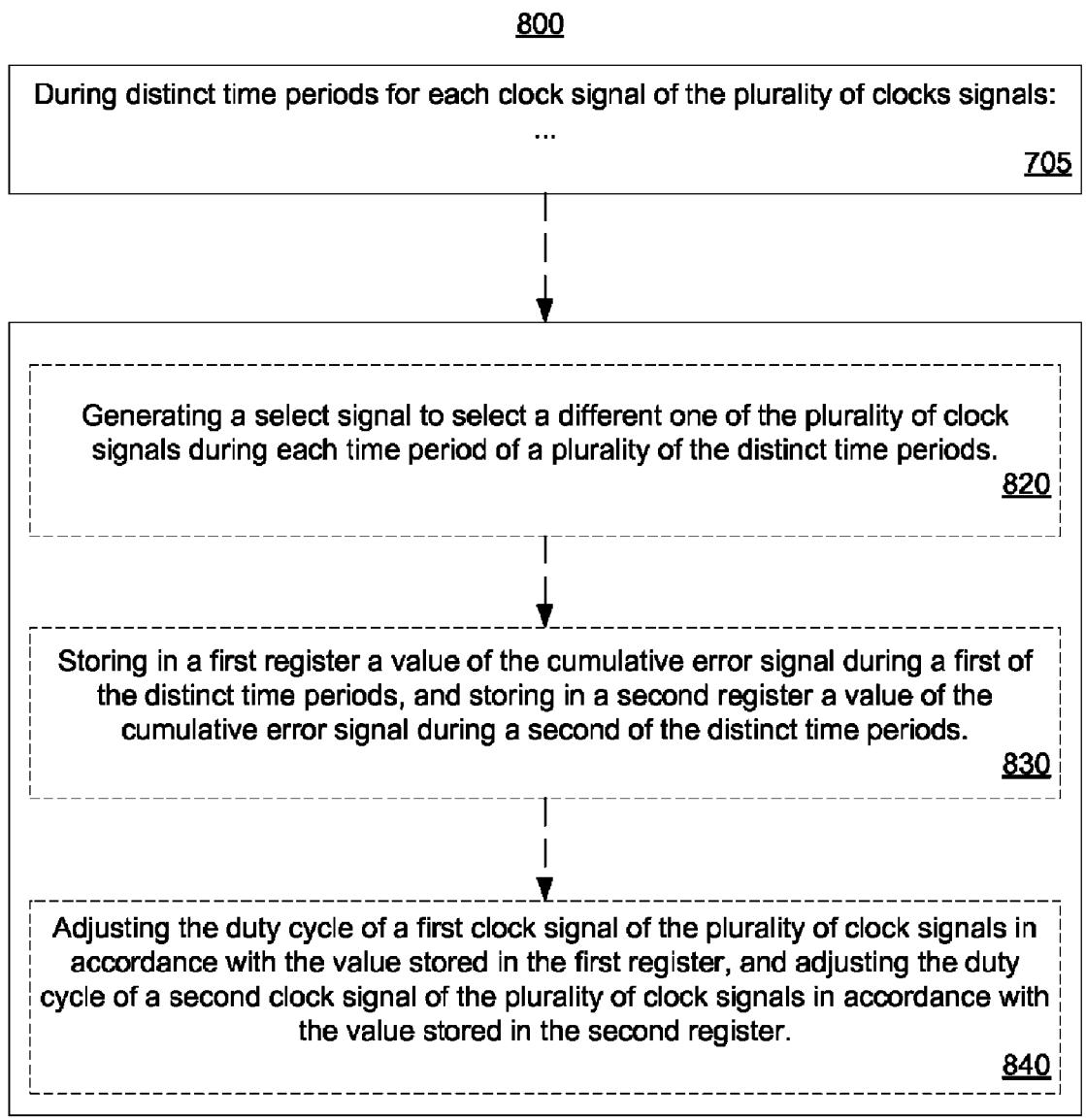
FIG. 8 is a flowchart illustrating a second method of multiplexing a duty cycle detector for multiple clocks according to certain embodiments of the invention.

FIG. 8 is a flowchart illustrating a second method 800 of multiplexing a duty cycle detector for multiple clocks according to certain embodiments of the invention. The second method 800 includes the first method 705, with one or more additional operations performed. A select signal is generated (820) to select a different one of the plurality of clock signals during each time period of a plurality of distinct time periods. A value of the cumulative error signal during a first of the distinct time periods is stored in a first register, and a value of the cumulative error signal during a second of the distinct time periods is stored in a second register (830). The duty cycle of a first clock signal of the plurality of clock signals is adjusted in accordance with the value stored in the first register, and the duty cycle of a second clock signal of the plurality of clock signals is adjusted in accordance with the value stored in the second register (840).

Devices and circuits described herein can be implemented using computer aided design tools available in the art, and embodied by computer readable files containing software descriptions of such circuits, at behavioral, register transfer, logic component, transistor and layout geometry level descriptions stored on storage media or communicated by carrier waves. Data formats in which such descriptions can be implemented include, but are not limited to, formats supporting behavioral languages like C, formats supporting register transfer level RTL languages like Verilog and VHDL, and formats supporting geometry description languages like GDSII, GDSIII, GDSIV, CIF, MEBES and other suitable formats and languages. Data transfers of such files on machine readable media can be performed electronically over the diverse media on the Internet or through email, for example. Physical files can be implemented on machine readable storage media such as 4 mm magnetic tape, 8 mm magnetic tape, 3½ inch floppy media, CDs, DVDs, flash memory devices, and so on.

The foregoing descriptions of specific embodiments of the present embodiments are presented for purposes of illustration and description. They are not intended to be exhaustive or to limit the disclosure to the precise forms disclosed. Rather, it should be appreciated that many modifications and variations are possible in view of the above teachings. The embodiments were chosen and described in order to best explain the principles of the disclosure and its practical applications, to thereby enable others skilled in the art to best utilize the disclosure and various embodiments with various modifications as are suited to the particular use contemplated.

What is claimed is:

1. Clock circuitry, comprising:
a first clock generator to generate a first clock signal and having a first duty cycle correction input;
a second clock generator to generate a second clock signal and having a second duty cycle correction input;
a duty cycle circuit having a clock input and an output, the duty cycle circuit to generate a duty cycle correction signal on the output of the duty cycle circuit;
a multiplexer having a first input coupled to the first clock signal and having a second input coupled to the second clock signal, and having a clock output coupled to the clock input of the duty cycle circuit; and
control circuitry to generate a select signal coupled to the multiplexer for selecting between inputs of the multiplexer, wherein the control circuitry includes a counter to generate the select signal, and wherein the counter controls cycling of the select signal.

2. Clock circuitry, comprising:
a first clock generator to generate a first clock signal and having a first duty cycle correction input;
a second clock generator to generate a second clock signal and having a second duty cycle correction input;
a duty cycle circuit having a clock input and an output, the duty cycle circuit to generate a duty cycle correction signal on the output of the duty cycle circuit;
a multiplexer having a first input coupled to the first clock signal and having a second input coupled to the second clock signal, and having a clock output coupled to the clock input of the duty cycle circuit; and
control circuitry to generate a select signal coupled to the multiplexer for selecting between inputs of the multiplexer, wherein the duty cycle correction signal comprises a duty cycle correction value, the clock circuitry further comprising a first register having an input and an output, wherein the first duty cycle correction input is coupled to the output of the first register, and comprising a second register having an input and an output, wherein the second duty cycle correction input is coupled to the output of the second register, and wherein the output of the duty cycle circuit is coupled to the input of the first register and the input of the second register.

3. The clock circuitry of claim 2, wherein the first register and second register are controlled by the select signal.

4. Clock circuitry, comprising:
a first clock generator to generate a first clock signal and having a first duty cycle correction input;
a second clock generator to generate a second clock signal and having a second duty cycle correction input; and
a duty cycle circuit having a clock input and an output, the duty cycle circuit to generate a duty cycle correction signal on the output of the duty cycle circuit;
a multiplexer having a first input coupled to the first clock signal and having a second input coupled to the second clock signal, and having a clock output coupled to the clock input of the duty cycle circuit; and
control circuitry to generate a select signal coupled to the multiplexer for selecting between inputs of the multiplexer, wherein the duty cycle circuit includes:
a duty cycle detector to generate an incremental error signal for the clock input to the duty cycle detector; and
a duty cycle error accumulator to generate a duty cycle correction signal representing an accumulated error measurement in response to the incremental error signal.

5. The clock circuitry of claim 4, wherein the duty cycle error accumulator comprises a first internal register and a second internal register for storing duty cycle errors for the first clock and second clock respectively, and wherein the first internal register is coupled to the first duty cycle correction input and the second internal register is coupled to the second duty cycle correction input.

6. The clock circuitry of claim 5, wherein the select signal is coupled to the duty cycle error accumulator for selecting between the first internal register and second internal register.

7. The clock circuitry of claim 4, wherein the incremental error signal comprises an error polarity measurement of the clock input.

8. The clock circuitry of claim 4, wherein the duty cycle detector is resettable.

9. The clock circuitry of claim 4, wherein the duty cycle detector is programmable.

10. The clock circuitry of claim 4, wherein the duty cycle detector comprises a charge pump and a digital to analog converter connected to the charge pump, the digital to analog converter having a digital input for duty cycle selection.

11. Clock circuitry, comprising:
a multiplexer having a first input and second input;
a duty cycle circuit coupled to an output of the multiplexer, the duty cycle circuit having a clock input and an correction signal output, the duty cycle circuit to generate a duty cycle correction signal on the correction signal output of the duty cycle circuit; and
a clock generator circuit, comprising:
a duty cycle shaping circuit, having a clock signal input and an input coupled to the correction signal output of the duty cycle circuit, and having an output;
a transmit clock buffer coupled to the output of the duty cycle shaping circuit, wherein the transmit clock buffer has a transmit clock output coupled to the first input of the multiplexer; and
a receive clock buffer coupled to the output of the duty cycle shaping circuit; wherein the receive clock buffer has a receive clock output coupled to the second input of the multiplexer.

12. The circuit of claim 11, further comprising a digital to analog converter coupled between the duty cycle circuit and the duty cycle shaping circuit, wherein the digital to analog converter converts a digital output of the duty cycle circuit into an analog input to the duty cycle shaping circuit.

13. The circuit of claim 11, further comprising a select signal coupled to the multiplexer for selecting between the transmit clock output and the receive clock output.

14. The circuit of claim 13, wherein during a predefined period the select signal cycles through selecting the transmit clock output and receive clock output.

15. The circuit of claim 11, wherein the duty cycle circuit includes:

a duty cycle detector coupled to the multiplexer, wherein the duty cycle detector generates an incremental error measurement in the presence of a duty cycle error in the clock input of the duty cycle circuit; and a duty cycle error accumulator, coupled to the duty cycle detector, to generate the duty cycle correction signal, the duty cycle correction signal representing an accumulated error measurement in response to the incremental error measurement.

16. A method of adjusting the duty cycles of a plurality of clock signals, comprising the steps of:
during distinct time periods for each clock signal of the plurality of clock signals,
providing one clock signal of the plurality of clock signals to a duty cycle detector;
generating an error signal in response to an output of the duty cycle detector;
adjusting the duty cycle of the clock signal in response to the error signal, wherein the duty cycle detector is used for processing all of the clock signals of the plurality of clock signals, in sequence, during the distinct time periods;
generating a select signal to select a different one of the plurality of clock signals during each time period of a plurality of the distinct time periods; and
incrementing or decrementing a counter to generate the select signal.

17. The method of claim 16, including storing in a first register a value of the error signal during a first of the distinct time periods, and storing in a second register a value of the error signal during a second of the distinct time periods.

18. The method of claim 17, including adjusting the duty cycle of a first clock signal of the plurality of clock signals in accordance with the value stored in the first register, and adjusting the duty cycle of a second clock signal of the plurality of clock signals in accordance with the value stored in the second register.

* * * * *